United States Patent [19]
Roth

[11] Patent Number: 5,016,082
[45] Date of Patent: May 14, 1991

[54] INTEGRATED CIRCUIT INTERCONNECT DESIGN

[75] Inventor: Norman J. Roth, Kokomo, Ind.

[73] Assignee: Delco Electronics Corporation, Kokomo, Ind.

[21] Appl. No.: 539,277

[22] Filed: Jun. 18, 1990

Related U.S. Application Data

[63] Continuation of Ser. No. 245,094, Sep. 16, 1988, abandoned.

[51] Int. Cl.$^5$ .................... H01L 23/495; H01L 23/535
[52] U.S. Cl. .......................................... 357/70; 357/68
[58] Field of Search ............................. 357/69, 70, 68

[56] References Cited

U.S. PATENT DOCUMENTS

| | | | |
|---|---|---|---|
| 3,798,509 | 3/1974 | Vladik | 357/70 |
| 4,010,488 | 3/1977 | Gruszka et al. | 357/70 |
| 4,034,149 | 7/1977 | Zaleckas | 357/70 |
| 4,188,636 | 2/1980 | Sato et al. | 357/69 |
| 4,413,404 | 11/1983 | Burns | 357/70 |
| 4,558,345 | 12/1985 | Dwyer et al. | 357/70 |

OTHER PUBLICATIONS

Dowdle, D. M., "Flex Takes on Boarders", Circuits Manufacturing, Dec. '87, pp. 79–86.

Primary Examiner—William D. Larkins
Attorney, Agent, or Firm—Domenica N. Hartman

[57] ABSTRACT

A plurality of discrete bonding sites on an integrated circuit chip are electrically interconnected using a unique electrical interconnection lead. The interconnection lead comprises an electrically conductive strip having a first end and a second end. The strip is integrally connected at its first end to an electrically conductive tape comprising a plurality of conductive strips. The interconnection lead further comprises a plurality of bonding regions provided between the first and second ends of the conductive strip. These bonding regions provide the sites wherein the conductive strip is electrically connected to the appropriate bond site on the chip. The interconnection lead is suitable for use with tape automated bonding and flexible circuitry techniques.

2 Claims, 2 Drawing Sheets

INTEGRATED CIRCUIT INTERCONNECT DESIGN

This is a continuation of U.S. application Ser. No. 07/245,094 filed on Sept. 16, 1988, now abandoned.

This invention relates to the design of electrical interconnection leads which are suitable for electrically interconnecting various regions on an integrated circuit. More particularly, this invention relates to the design of individual electrical interconnection leads wherein each lead provides a plurality of electrical interconnections on a single integrated circuit. Even more particularly, this invention relates to electrical interconnection of leads which are compatible with tape automated bonding when using TAB tape or flexible circuitry techniques.

BACKGROUND OF THE INVENTION

Many methods are known for forming the electrical interconnections between an integrated circuit and the supporting substrate. Tape automated bonding (TAB) is one commonly known method for forming these such electrical interconnections. A TAB tape is provided which comprises a plurality of individual long, slender inner leads attached to, and extending out from, generally wider, larger outer leads. There may be many of these inner/outer lead configurations on a single TAB tape.

An individual inner lead on the TAB tape is bonded to the integrated circuit at a bonding pad so as to form an inner lead bond. There are typically many of these inner lead bonds on a single integrated circuit. The inner lead bonds are typically formed by first depositing a gold bump, or other suitable material, on either the end of the TAB tape inner lead or on the integrated circuit itself. The integrated circuit and TAB tape inner leads, which are generally copper, are then aligned and simultaneously thermocompression gang bonded.

After bonding between the integrated circuit and the TAB tape inner leads is complete, the integrated circuit assembly is excised from the TAB tape at a point beyond the outer lead, so that the outer lead remains attached to the bonded inner lead and integrated circuit. The integrated circuit assembly is subsequently mounted on the substrate and the outer leads are appropriately bonded to the substrate.

In an alternative bonding method, a flexible circuit (FLEX) is used to provide the individual inner leads to form the electrical interconnections between the integrated circuit and the substrate, the substrate being an integral part of the flexible circuit itself. The FLEX circuit consists of a patterned arrangement of conductors on a flexible insulating base substrate with or without cover layers. The FLEX circuit may be single or double sided, multilayered or rigidized, in addition to other possible arrangements. The FLEX circuit may be formed by several methods, such as by laminating copper foil to any of several base substrate materials, or alternatively pattern plating copper directly onto the substrate.

The FLEX circuit is advantageous in that it contains both the internal and external integrated circuit chip interconnections. The inner leads are adjacent to and an integral part of the flexible circuitry pattern. Outer leads are not required, as with the TAB tape technology, because the individual inner leads are incorporated within the flexible circuitry pattern. Therefore outer lead bonds are not necessary and correspondingly the number of inner connections are substantially reduced. In addition, the flexible circuitry pattern is supported by and electrically integral with the flexible substrate at the appropriate regions.

For these reasons, FLEX circuitry technology has many advantages. FLEX circuitry significantly reduces the number of chip interconnections resulting in reduced lead inductance and lead-to-lead capacitance, as well as increased product reliability. In addition, the use of the FLEX circuitry permits smaller integrated circuits and interconnection patterns because the chip is mounted directly onto the patterned substrate.

However, despite the above-described advantages for both the TAB tape bonding and FLEX circuitry technologies, a significant disadvantage exists. Generally with these technologies, electrical current flows from the conductor, through the bond region on the integrated circuit, and subsequently proceeds through the layer of metallization on the integrated circuit to the desired region on the integrated circuit. In addition, generally separate electrical conductors are employed for each electrical interconnection formed on the integrated circuit. Therefore, if an electrical interconnection is required between discrete points on an integrated circuit, this interconnection is provided by a subsequent separate metallization layer or discrete conductive wire.

These prior art methods result in very high current densities in the bond regions and the metallization layers on the integrated circuit, particularly in high power transistor applications. In addition, because it is preferable that the thickness of the layer of metallization on the integrated circuit be minimized, it is difficult to maintain a low electrical resistance between the electrically interconnected regions on the integrated circuit.

Therefore, although there are many advantages associated with these prior art methods, wherein the interconnection leads are provided by discrete layers of metallization or conductive wires, there are disadvantages also. The prior methods are generally characterized by (1) high current density in the bond areas and the metallization layers of the integrated circuit and (2) increased electrical resistance between the interconnected regions on the integrated circuit, resulting in decreased electrical properties and performance.

It is therefore advantageous to provide an electrical interconnection lead, suitable for electrically interconnecting discrete regions of an integrated circuit, which is not formed by a separate wire or metallization layer, and which is also electrically efficient. Further, it is desirable that the provided interconnection lead be compatible with tape automated bonding (TAB) and flexible circuitry (FLEX) technologies.

SUMMARY OF THE INVENTION

It is therefore an object of this invention to provide an electrical interconnection lead suitable for electrically interconnecting a plurality of discrete regions on an integrated circuit.

It is a further object of this invention that the provided electrical interconnection lead have efficient electrical characteristics.

It is still a further object of this invention to provide an electrical interconnection lead which is compatible with either the tape automated bonding or flexible circuitry technologies.

In accordance with a preferred embodiment of this invention, these and other objects and advantages are accomplished as follows.

This invention comprehends an electrical interconnection lead for electrically interconnecting a plurality of discrete bonding sites on an integrated circuit. The interconnection lead comprises an electrically conductive strip having a first end and a second end. The strip is integrally connected at its first end to an electrically conductive tape comprising a plurality of conductive strips. In a first embodiment the conductive tape is suitable for use with tape automated bonding techniques. The interconnection lead further comprises a plurality of bonding regions. The bonding regions are provided between the first and second ends of the conductive strip. These bonding regions provide the sites wherein the conductive strip is electrically connected to the plurality of appropriate bond sites on the integrated circuit.

In a second preferred embodiment, the interconnection lead is compatible with the flexible circuitry technology. In this embodiment, the electrically conductive interconnection lead is integrally connected, at its first end, to a conductive flexible circuitry pattern. Bonding regions are similarly provided between the first and second ends of the conductive strip and provide the sites wherein the conductive strip is electrically connected to a plurality of bond sites on the integrated circuit.

With this invention, the TAB tape or flexible circuit also electrically interconnects discrete regions on the integrated circuit, thereby reducing electrical resistance and also eliminating the need for an extra layer of metallization. Therefore, this invention provides a layer of interconnect without an additional metallization layer.

Other objects and advantages of this invention will be appreciated from a detailed description thereof, which follows.

BRIEF DESCRIPTION OF THE DRAWINGS

The following detailed description of the invention may be best understood when reference is made to the accompanying drawing.

DETAILED DESCRIPTION

In accordance with this invention, the shortcomings of the currently used methods for forming electrical interconnections are overcome by providing an electrical conductor having a plurality of bonding regions. An individual interconnection lead electrically interconnects a plurality of discrete bonding sites on the integrated circuit chip. This interconnection lead permits lower operating current densities and reduced resistances between the various electrically interconnected regions on the chip. This interconnection lead provides improved electrical characteristics.

Figure 1:
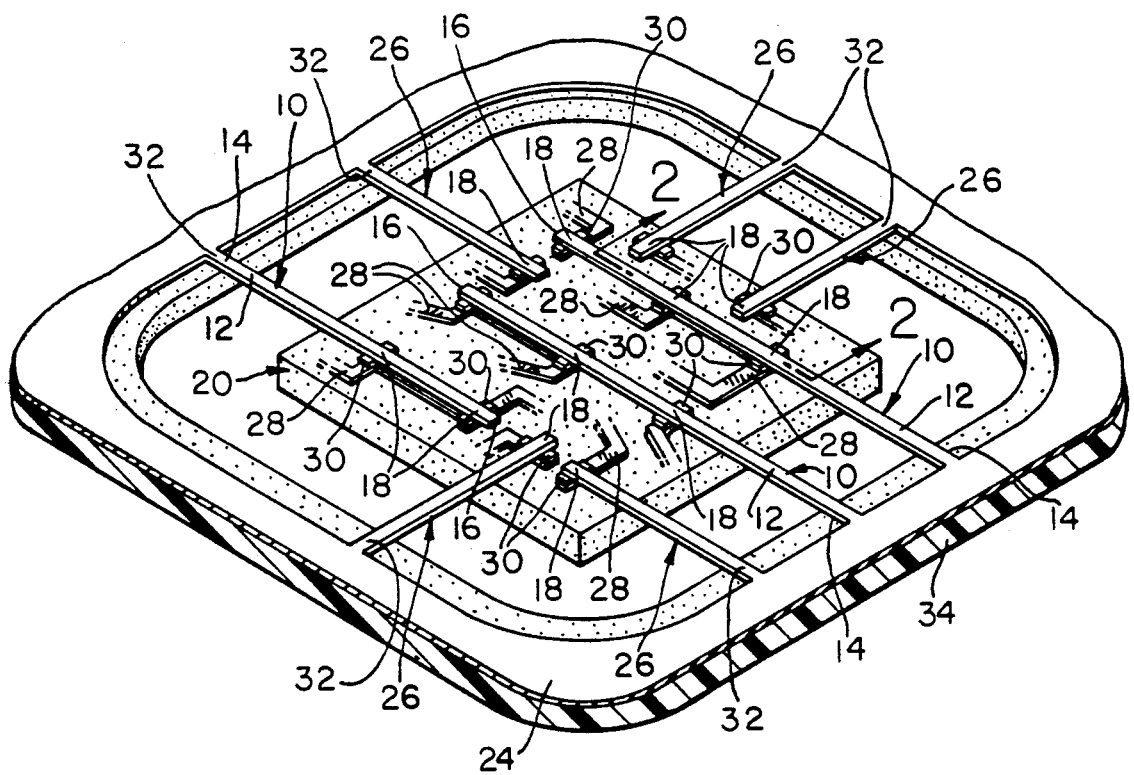
FIG. 1 is a perspective view of interconnection leads made in accordance with this invention using tape automated bonding technology.

As illustrated in FIG. 1, a plurality of electrical interconnection leads 10 formed in accordance with this invention for electrically interconnecting discrete regions on a monolithic integrated circuit chip 20 are shown. The interconnection leads 10 comprise an electrically conductive strip 12 having a first end 14 and a second end 16. The interconnection lead 10 is preferably formed from copper due to its availability and practicality, however, other suitable electrically conductive materials such as silver may also be used.

The interconnection lead 10 further comprises a plurality of bonding regions 18. The bonding regions 18 are provided between the first and second ends, 14 and 16 respectively, of the conductive strip 12. These bonding regions 18 provide the sites wherein the conductive strip 12 is electrically connected to the discrete regions of the integrated circuit 20. The bonding regions 18 comprise the same material as the conductive strip 12 and are an integral part of the conductive strip 12 forming the interconnect lead 10.

The bonding regions 18 are preferably approximately as long as they are wide, which is the approximate width of the conductive strip 12. Suitable results may also be obtained when the length of the bonding region 18 is up to about 3 times its width and as small as about one fourth the width. However, due to dimensional constraints, it is desirable to minimize the length of the bonding regions 18, although it is also necessary to provide a large enough bonding region 18 so that reliable contact between the integrated circuit 20 and interconnection lead 10 may be formed.

The number of bonding regions 18 on a single interconnect lead 10 is theoretically limited only by the dimensions of the conductive strip 12 and the integrated circuit chip 20. However, it is preferred, for high volume production applications, that the number of bonding regions 18 does not exceed about three. When there are greater than about three bonding regions 18, the interconnect lead 10 becomes relatively long in relation to its width and handling and processing of the strip 12 becomes difficult. Because the strip 12 becomes more susceptible to misalignment during handling and processing as the length increases, it is desirable for practical purposes to limit the strip 12 length by having no greater than about three bonding regions 18 on the lead 10. For low volume applications, where more care may be taken during the handling of the lead 10, the number of bonding regions 18 may be increased and is limited only by dimensional constraints of the lead 10 and integrated circuit chip 20.

FIG. 1 illustrates a first embodiment of this invention, wherein the electrically conductive strip 12 is integrally connected at its first end 14 to an electrically conductive tape 24 comprising a plurality of conductive strips 12. The conductive strips 12 may vary in that some may have a plurality of bond regions 18, as shown in interconnection lead 10, or have only a single bond region, as shown in lead 26. However, a lead 26 having a single bond region 18 is not within the scope of this claimed invention. A thin layer 28 of metallization, such as a thin film layer 28 of copper, silver or other suitable electrically conductive material which is also compatible with the gold bump used to bond the lead 10 to the chip 20, is provided and patterned on the surface of the integrated circuit 20 so as to electrically couple selected discrete regions of the integrated circuit 20.

The electrically conductive tape 24, or TAB tape, which comprises the plurality of electrically conductive strips 12, is suitable for use with tape automated bonding techniques. The bond pad 30 on the integrated circuit 20, as shown in the FIGS. 1 and 2, typically comprises a gold bump, however other suitable materials such as palladium, or a multi-layered bump comprising copper, nickel, and a gold flash, or other appropriate materials may also be used. After alignment of the bonding regions 18 on the lead 10 with the bond pad 30 having the gold bumps, the bonding regions 18 are then thermocompression gang bonded to the integrated circuit 20 at the bond pad 30. Alternatively, the gold bump may be provided on the interconnection lead 10 at the bonding regions 18, subsequently aligned with the appropriate regions of the integrated circuit 20, and thermocompression gang bonded.

After the bonds between the integrated circuit 20 and the interconnection lead 10 are formed, the integrated circuit 20 is excised from the TAB tape 24 at a region 32 beyond where the outer bonds (not shown) will be formed on the supporting substrate 34. The integrated circuit 20 and bonded interconnection leads 10 are subsequently formed and mounted on the substrate 34 with solder or other suitable means.

Figure 2:
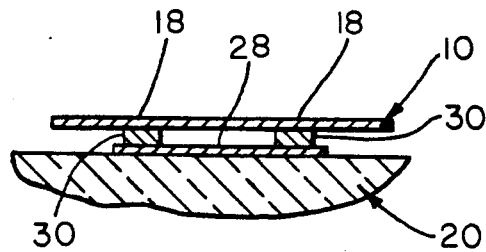
FIG. 2 is a side view of an interconnection lead and the bonded regions as shown in FIG. 1.

An advantage of this invention is best understood by viewing FIG. 2. A cross section of a plurality of bonds made in accordance with this invention is shown in FIG. 2. A bond pad 30 preferably having a gold bump is used to bond the copper interconnection lead 10 to the integrated circuit chip 20. The thin layer 28 of metallization is provided between the bond pad 30 having the gold bump and chip 20. The layer 28 of metallization is electrically conductive and patterned so as to electrically couple selected discrete regions of the integrated circuit 20.

Generally with the prior art methods for forming interconnections (typically discrete conductors bonded to only a single region), electrical current flows from the conductive interconnection lead, through the bonded region on the integrated circuit, and subsequently proceeds through the layer of metallization on the integrated circuit to the desired region on the integrated circuit. These prior methods result in very high current densities in the bonded regions and the surrounding metallization layers on the integrated circuit, particularly in high power transistor applications, since all of the current flowing through the conductor is discharged at a single bond site. In addition, the electrical resistance is undesirably high between regions on the integrated circuit, because of (1) the relatively long current path on the integrated circuit; (2) the desirability to minimize the thickness of the layer of metallization on the integrated circuit; and (3) restricted width of circuit paths on the integrated circuit. These disadvantages associated with the prior art tend to result in decreased electrical properties and performance of the integrated circuit.

As shown in FIG. 2, these prior disadvantages are significantly reduced using interconnection leads 10 in accordance with this invention. The interconnection lead 10, or conductor, discharges its current at a plurality of bonded regions 36, as shown in FIG. 2. Therefore, the current density in the surrounding metallization layer 28 is correspondingly reduced. Further, the reduced current density results in lower values of electrical resistance within the metallization layer 28. Therefore, the multiple bonds provided by this invention permit (1) a preferably thin metallization layer 28 without excessively high electrical resistance or current density values, and (2) overall enhanced electrical efficiency and performance of the integrated circuit 20. In addition, this invention provides a layer of electrical interconnection between the discrete bonded regions of the integrated circuit, thereby eliminating a layer of metallization or alternatively permitting more levels of interconnection.

Figure 3:
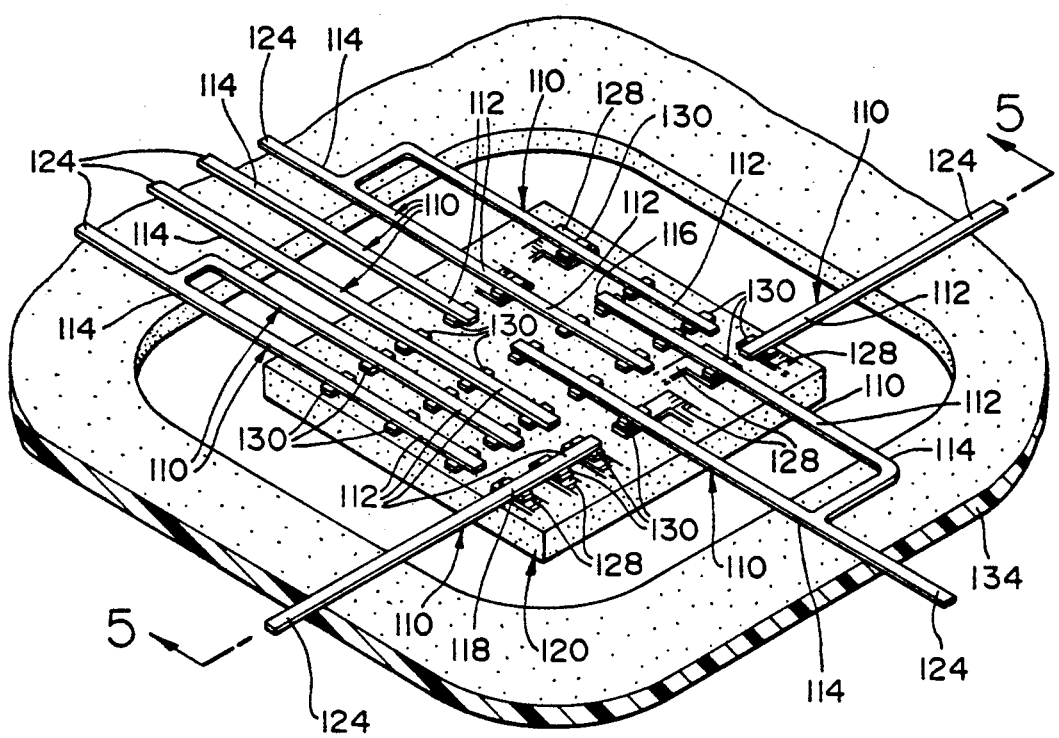
FIG. 3 is a perspective view of interconnection leads made in accordance with this invention using flexible circuitry technology.

The present method is equally compatible with the flexible circuitry technology, as shown in FIG. 3. The flexible circuit 124 (FLEX) is used to form the electrical interconnections 110 between the discrete regions on the integrated circuit 120. The supporting substrate 134 is an integral part of the flexible circuit 124 itself. The FLEX circuit 124 consists of a patterned arrangement of conductors 112 on a flexible insulating base substrate 134 generally formed from an organic material such as a polyimide or milar material. The substrate 134 may have other covering layers. The FLEX circuit 124 may be single or double sided, multilayered or rigidized, in addition to other possible arrangements. The FLEX circuit 124 may be formed by several methods, such as by laminating copper foil to any of several base substrate 134 materials, or alternatively pattern plating copper directly onto the substrate 134.

The flexible circuitry copper patterns 124 may be patterned so as to include the interconnection leads 110 in accordance with this invention. With the use of flexible circuitry technology, the first end 114 of the interconnection leads 110 is integrated into the flexible, conductive interconnection pattern 112, so that the individual interconnection leads 110 extend out from the flexible circuitry pattern 124, and are subsequently bonded to the bond pad 130 on the integrated circuit 120 at the plurality of bonding regions 118 which are located between the first and second ends, 114 and 116 respectively, of the interconnection lead 110. Because outer lead bonds are not required to bond the flexible circuitry 124 to the substrate 134, a significant reduction in bonds is realized, therefore improving the producibility and reliability of the system.

Figure 4:
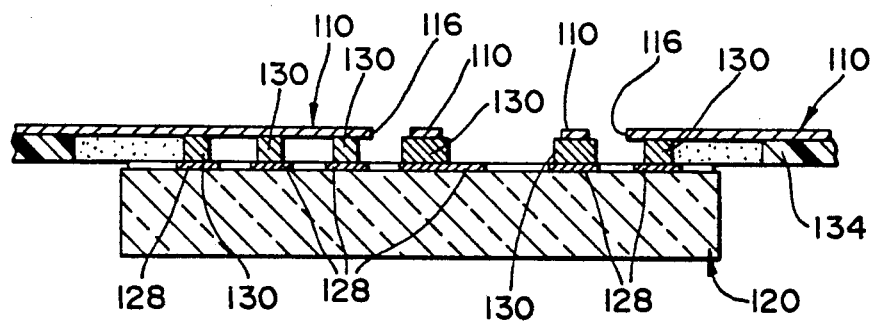
FIG. 4 is a side view of the interconnection leads and the bonded regions as shown in FIG. 3.

FIG. 4 illustrates a cross section through the bonding regions 118 formed with the interconnection leads 110 shown in FIG. 3. The advantages described above with respect to the tape automated bonding technology are realized with the flexible circuitry technology. As stated above, current flows from the conductive interconnection lead 110, through the bond pad 130 having a gold bump or other suitable material, and the patterned metallization layer 128 to the selected discrete regions 1 of the integrated circuit 120. With this invention, the current density is reduced due to the plurality of bonding regions 118 for each interconnection lead 110 and the resistance within the metallization layer 128 is also reduced, thereby improving the electrical performance and characteristics of the integrated circuit 120. In addition, as stated previously with regard to the TAB tape technology, this invention permits additional levels of electrical interconnection.

As a result of the interconnection lead designed in accordance with the present invention, a plurality of bonds are formed on the integrated circuit with an individual interconnection lead. The present invention is entirely compatible with tape automated bonding and flexible circuitry technologies and provides improved electrical performance and characteristics.

While our invention has been described in terms of preferred embodiments, it is apparent that other forms could be adopted by one skilled in the art. Accordingly the scope of our invention is to be limited only by the following claims.

The embodiments of the invention in which an exclusive property or privilege is claimed are defined as follows:

1. The combination comprising:

a monolithic integrated circuit chip; and an interconnection lead suitable for electrically interconnecting a plurality of bonding sites on said monolithic integrated circuit chip, the interconnection lead comprising:

an electrically conductive copper strip having a first end and a second end, said strip being physically connected at said first end to an electrically conductive tape comprising a plurality of these said conductive strips so that said tape is suitable for use with tape automated bonding techniques; and between three to five bonding regions on said strip, each of said bonding regions having a bonding bump disposed thereon, said bonding regions being provided between said first electrical connection between said strip and said integrated circuit through said bonding bump;

such that said interconnection lead is electrically connected at said bonding regions to a corresponding number of regions on said integrated circuit.

2. The combination comprising:

a monolithic integrated circuit chip; and an interconnection lead suitable for electrically interconnecting a plurality of bonding sites on said monolithic integrated circuit chip, the interconnection lead comprising:

an electrically conductive copper strip having a first end and a second end, said strip being physically connected at said first end to an electrically conductive circuitry pattern comprising a plurality of these said conductive strips; and between three to five bonding regions on said strip, each of said bonding regions having a bonding bump disposed thereon, said bonding regions being provided between said first electrical connection between said strip and said integrated circuit through said bonding bump;

such that said interconnection lead is electrically connected at said bonding regions to a corresponding number of regions on said integrated circuit.

* * * * *